United States Patent
Yu et al.

(10) Patent No.: US 11,658,102 B2
(45) Date of Patent: May 23, 2023

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Yuanhao Yu, Kaohsiung (TW); Cheng Yuan Chen, Kaohsiung (TW); Chun Chen Chen, Kaohsiung (TW); Jiming Li, Kaohsiung (TW); Chien-Wen Tu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 2 days.

(21) Appl. No.: 16/749,635

(22) Filed: Jan. 22, 2020

(65) Prior Publication Data
US 2021/0225747 A1    Jul. 22, 2021

(51) Int. Cl.
*H01L 23/498*  (2006.01)
*H01L 21/48*   (2006.01)
*H01L 23/66*   (2006.01)

(52) U.S. Cl.
CPC .... *H01L 23/49811* (2013.01); *H01L 21/4889* (2013.01); *H01L 23/66* (2013.01); *H01L 2223/6605* (2013.01)

(58) Field of Classification Search
CPC ............................ H01L 23/49811; H01L 23/66
See application file for complete search history.

(56) References Cited

U.S. PATENT DOCUMENTS

| | | | | |
|---|---|---|---|---|
| 6,534,854 B1* | 3/2003 | Fazelpour | ......... | H01L 23/49811 257/203 |
| 7,847,404 B1* | 12/2010 | Schwegler | ........ | H01L 23/49827 257/758 |
| 2005/0277315 A1* | 12/2005 | Mongold | ........... | H01R 13/6474 439/108 |
| 2007/0188997 A1* | 8/2007 | Hockanson | ............. | H01L 23/50 361/760 |
| 2008/0290497 A1* | 11/2008 | Sugaya | .................... | H01L 23/66 361/811 |
| 2017/0271175 A1* | 9/2017 | Healy | .................... | H01L 21/563 |
| 2018/0033753 A1* | 2/2018 | Camarota | .......... | H01L 23/49816 |
| 2018/0041250 A1* | 2/2018 | Guillot | ................ | H04L 25/0266 |
| 2018/0069333 A1* | 3/2018 | Sunaga | ............... | H01R 13/6587 |
| 2019/0393166 A1* | 12/2019 | Otsubo | .................... | H01L 25/18 |
| 2020/0027837 A1* | 1/2020 | Jeng | ...................... | H01L 23/5385 |
| 2020/0203288 A1* | 6/2020 | Otsubo | .................... | H01L 23/552 |
| 2020/0281102 A1* | 9/2020 | Otsubo | .................... | H01L 25/18 |

FOREIGN PATENT DOCUMENTS

CN            110096010 A   *  8/2019

* cited by examiner

*Primary Examiner* — Michele Fan
(74) *Attorney, Agent, or Firm* — Foley & Lardner LLP (57) ABSTRACT

A semiconductor device package includes a carrier, an electronic component and a connector. The electronic component is disposed on the carrier. The connector is disposed on the carrier and electrically connected to the electronic component. A S11 parameter of the connector is less than −20 dB.

12 Claims, 9 Drawing Sheets

SEMICONDUCTOR DEVICE PACKAGE AND METHOD OF MANUFACTURING THE SAME

TECHNICAL FIELD

The present disclosure relates to a semiconductor device package, and more particularly, to a semiconductor device package including one or more connectors.

DESCRIPTION OF THE RELATED ART

In existing electrical devices, electronic components (e.g., chips, dies, passive components) and many high-speed bus connectors are mounted on a printed circuit board (PCB) and the electronic components are communicated with each other through the PCB and the bus connectors. However, long signal transmission paths on the PCB would cause a transmission loss issue and a heat dissipation issue. In addition, the signal transmitted from one connector to an electronic component or from one connector to another connector would pass various mediums, which would cause an impedance mismatch issue.

SUMMARY

In some embodiments, a semiconductor device package includes a carrier, an electronic component and a connector. The electronic component is disposed on the carrier. The connector is disposed on the carrier and electrically connected to the electronic component. A S11 parameter of the connector is less than −20 dB.

In some embodiments, a semiconductor device package includes a carrier, an electronic component and a connector. The electronic component is disposed on the carrier. The connector is disposed on the carrier and electrically connected to the electronic component. The connector has a first group of pins, a second group of pins and a common ground pin disposed between the first group of pins and the second group of pins to separate the first group of pins and the second group of pins.

In some embodiments, a semiconductor device package includes a carrier, an electronic component and a connector. The electronic component is disposed on the carrier. The connector is disposed on the carrier and electrically connected to the electronic component. The connector has a first group of pins and a second group of pins. A pitch of two adjacent pins of the first group of pins is different from a pitch of two adjacent pins of the second group of pins.

In some embodiments, a method for manufacturing a connector includes (a) providing a carrier, (b) disposing a first group of pins, a second group of pins and a common ground pin on the carrier, the common ground pin disposed between the first group of pins and the second group of pins to separate the first group of pins and the second group of pins, and (c) forming an insulation layer to cover the first group of pins, the second group of pins and the common ground pin and to expose a top portion of the first group of pins, the second group of pins and the common ground pin.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

Common reference numerals are used throughout the drawings and the detailed description to indicate the same or similar components. The present disclosure can be best understood from the following detailed description taken in conjunction with the accompanying drawings.

DETAILED DESCRIPTION

Figure 1:
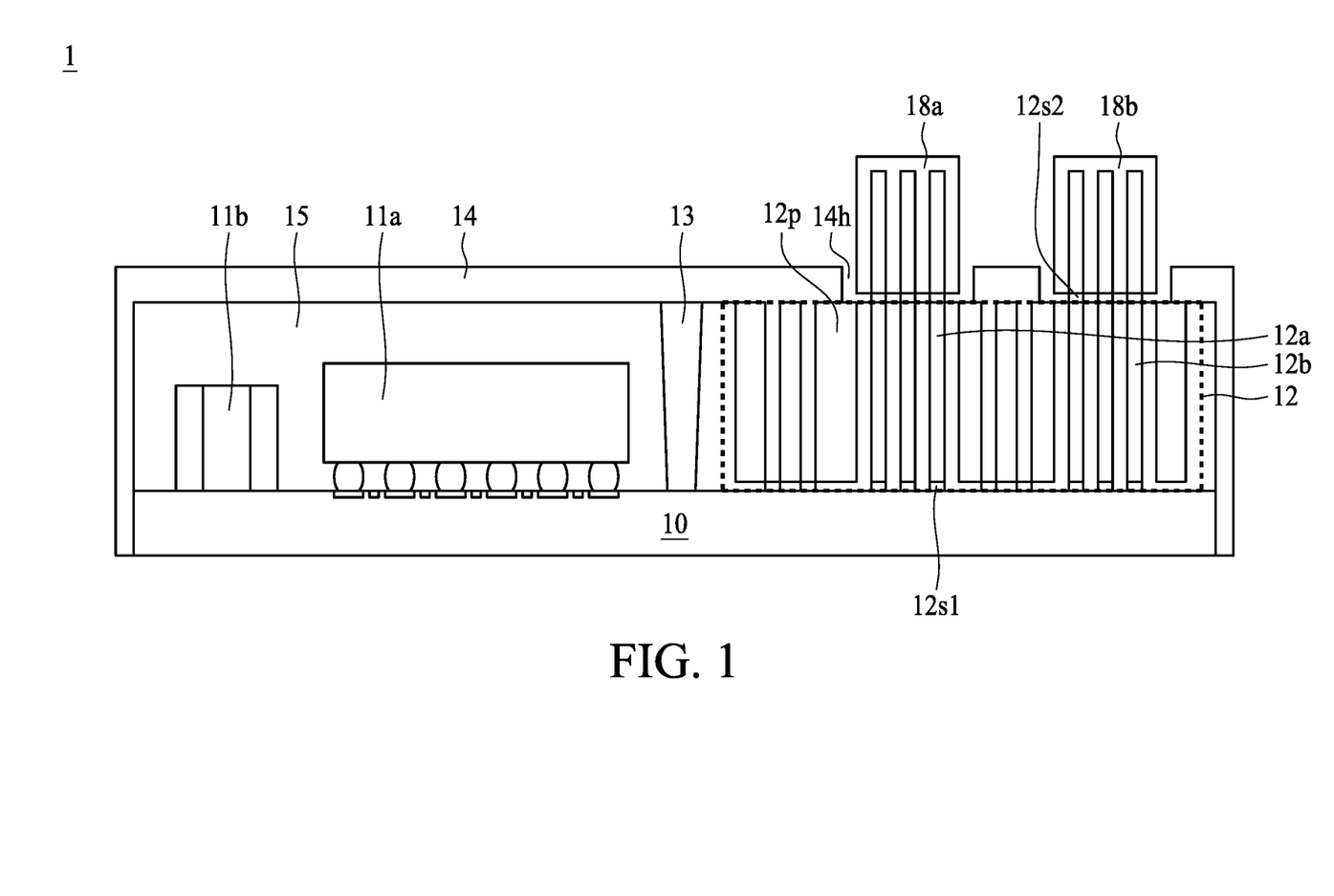
FIG. 1 illustrates a cross-sectional view of a semiconductor device package in accordance with some embodiments of the present disclosure.
Figure 2:
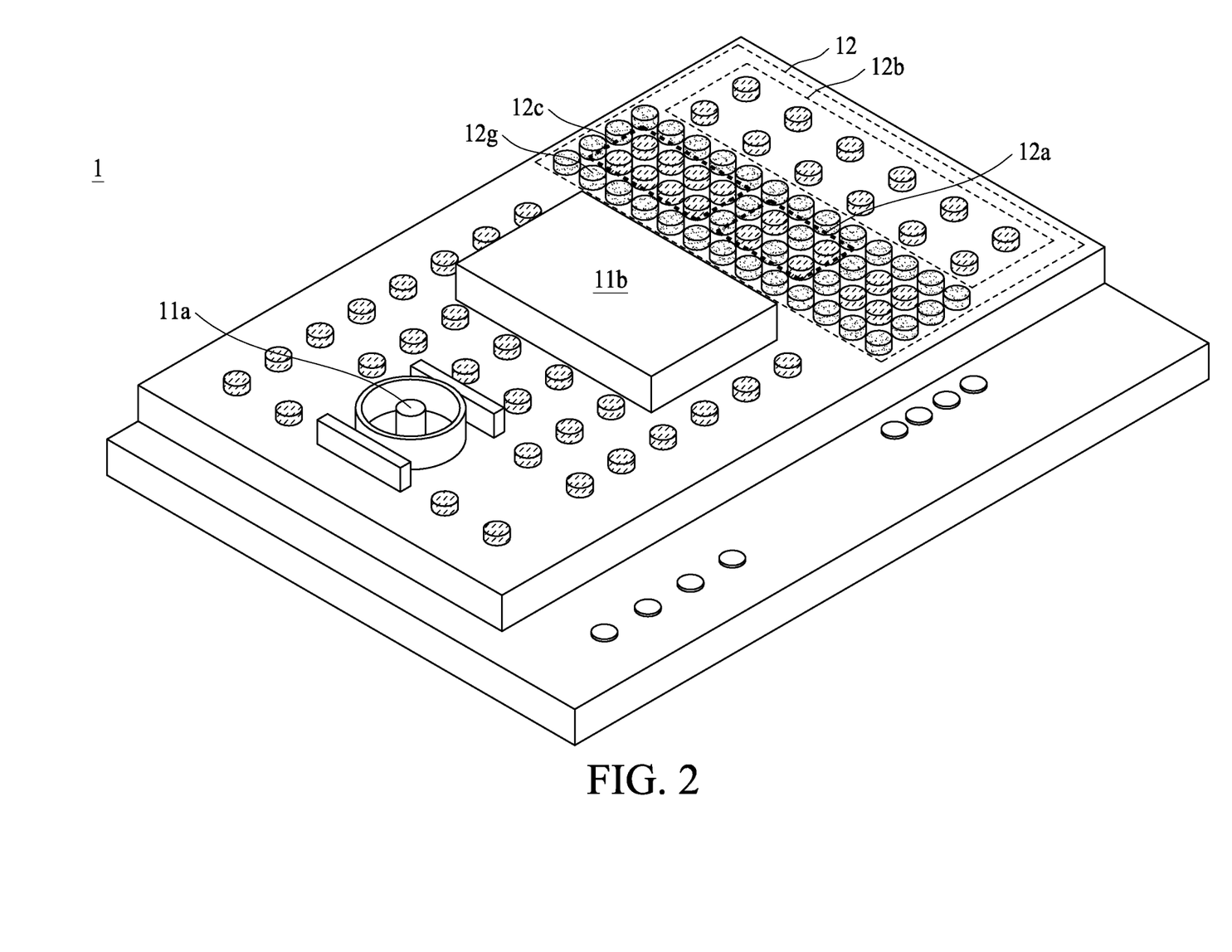
FIG. 2 illustrates a perspective view of a semiconductor device package in accordance with some embodiments of the present disclosure.

FIG. 1 illustrates a cross-sectional view of a semiconductor device package 1 in accordance with some embodiments of the present disclosure. FIG. 2 illustrates a perspective view of the semiconductor device package 1 in accordance with some embodiments of the present disclosure (for clarity, some of the elements as shown in FIG. 1 are omitted in FIG. 2). The semiconductor device package 1 includes 1 carrier 10, electronic components 11a, 11b, a connector module 12, a conductive via 13, a shielding layer 14 and a package body 15.

The carrier 10 may include, for example, a printed circuit board, such as a paper-based copper foil laminate, a composite copper foil laminate, or a polymer-impregnated glass-fiber-based copper foil laminate. The carrier 10 may include an interconnection structure, such as a plurality of conductive traces or a through via. In some embodiments, the carrier 10 includes a ceramic material or a metal plate. In some embodiments, the carrier 10 may include a substrate, such as an organic substrate. In some embodiments, the carrier 10 may include a two-layer substrate which includes a core layer and a conductive material and/or structure disposed on an upper surface and a bottom surface of the carrier 10. The conductive material and/or structure may include a plurality of traces.

The electronic components 11a, 11b are disposed on the carrier 10. The electronic component 11a may be an active component, such as an integrated circuit (IC) chip or a die. The electronic component 11b may be a passive electrical component, such as a capacitor, a resistor or an inductor. Each electronic component 11a, 11b may be electrically connected to one or more of another electronic component 11a, 11b and to the carrier 10, and electrical connection may be attained by way of flip-chip or wire-bond techniques.

The connector module 12 is disposed on the carrier 10 through, for example, electrical contacts 12s1 (e.g., solder balls). The connector module 12 is electrically connected to the electronic component 11a and/or 11b. In some embodiments, the connector module 12 includes one or more connectors 12a, 12b and 12c. The connector module 12 may include any number of connectors depending on design specifications. In some embodiments, the connectors 12a, 12b and 12c are bus connectors. In some embodiments, the connectors 12a, 12b and 12c are high-speed bus connectors. For example, a bandwidth of each of the connectors 12a, 12b and 12c may be in a range from about 100 MHz to about 100

GHz. In some embodiments, the connectors 12a, 12b and 12c are different types of connectors. For example, as shown in FIG. 2, the connectors 12a, 12b and 12c have different numbers of pins. For example, the pitch (i.e., a distance between two adjacent pins) of the pins of the connector 12a is different from the pitch of the pins of the connector 12b or 12c. For example, a diameter of the pins of the connector 12a is different from that of the connector 12b or 12c. For example, a maternal of the pins of the connector 12a is different from that of the connector 12b or 12c. For example, a bandwidth or a data transmission rate of the connector 12a is different from that of the connector 12b or 12c. In other embodiments, the connectors 12a, 12b and 12c may be or include the same type of connector.

As shown in FIG. 2, each of the connectors 12a, 12b and 12c are surrounded by ground pins 12g. For example, the ground pins 12g are disposed on the periphery of each of the connectors 12a, 12b and 12c. For example, the connectors 12a, 12b and 12c are separated from each other by the ground pins 12g. The ground pins 12g may provide a shielding capability to prevent the interference (e.g., crosstalk) between two adjacent connectors. In some embodiments, the adjacent connectors (e.g., "the connector 12a and the connector 12b" or "the connector 12a and the connector 12c") may share common ground pins 12g. For example, there is only one row of ground pins 12g between the connector 12a and the connector 12b or between the connector 12a and the connector 12c. In other embodiments, each of the connectors 12a, 12b and 12c may include its individual ground pins. For example, there may be two or more rows of pins disposed between two adjacent connectors.

In some embodiments, the connectors 12a, 12b and 12c may be designed for transmitting single-ended signal, differential signal or a combination thereof. In some embodiments, the pins of the connectors 12a, 12b and 12c are formed of or include copper. In some embodiments, a length of the pins of the connectors 12a, 12b and 12c may be in a range from about 300 micrometer (μm) to about 2000 μm. In some embodiments, a diameter of the pins of the connectors 12a, 12b and 12c may be in a range from about 200 μm to about 500 μm. In some embodiments, a pitch of two adjacent signal pins of each of the connectors 12a, 12b and 12c is in a range from about 1 millimeter (mm) to about 3.5 mm. In some embodiments, a distance between a signal pin and an adjacent ground pin of each of the connectors 12a, 12b and 12c is in a range from about 1 mm to about 5 mm. In some embodiments, an impedance of each of the pins of the connectors 12a, 12b and 12c may be in a range from about 90 Ohm to about 100 Ohm. In some embodiments, when a frequency of signal transmitted through the connector 12a, 12b or 12c is in a range from about 100 MHz to about 25 GHz, a S11 parameter of the connector 12a, 12b or 12c is less than −20 dB.

Table I shows simulation results of the S11 parameter of the connector 12a, 12b or 12c (with the differential resistance of 100 Ohm) for various operation frequencies, in accordance with some embodiments of the present disclosure. In Table I, a pitch of two adjacent signal pins is about 3 mm and a pitch of a signal pin and an adjacent ground pin is about 2 mm.

TABLE I

| | 5 GHz | 8 GHz | 15 GHz | 25 GHz |
|---|---|---|---|---|
| S11 | −39.17 dB | −38.01 dB | −38.35 dB | −20.07 dB |

Table II shows simulation results of the S11 parameter of the connector 12a, 12b or 12c (with the differential resistance of 90 Ohm) for various operation frequencies, in accordance with some embodiments of the present disclosure. In Table II, a pitch of two adjacent signal pins is about 2 mm and a pitch of a signal pin and an adjacent ground pin is about 2.5 mm.

TABLE II

| | 5 GHz | 8 GHz | 15 GHz | 25 GHz |
|---|---|---|---|---|
| S11 | −47.76 dB | −37.88 dB | −31.05 dB | −20.00 dB |

Referring to FIG. 1, the connector module 12 includes a package body 12p to cover or encapsulate the connectors 12a and 12b. Parts of the connectors 12a and 12b (e.g., a top portion and the bottom portion) are exposed from the package body 12p for electrical connections. In some embodiments, the package body 12p includes an epoxy resin having fillers, a molding compound (e.g., an epoxy molding compound or other molding compound), a polyimide, a phenolic compound or material, a material with a silicone dispersed therein, or a combination thereof.

The conductive via 13 is disposed on the carrier 10. In some embodiments, the conductive via 13 is disposed between the electronic components 11a, 11b and the connector module 12. The conductive via 13 may act as a compartment shielding to provide electromagnetic interference (EMI) shielding for the electronic components 11a, 11b and the connector module 12. In some embodiments, the conductive via 13 may include, for example, aluminum (Al), copper (Cu), chromium (Cr), tin (Sn), gold (Au), silver (Ag), nickel (Ni) or stainless steel, or a mixture, an alloy, or other combination thereof.

The package body 15 is disposed on the carrier 10. The package body 15 covers or encapsulates the electronic components 11a, 11b, the connector module 12 and the conductive via 13. A portion of the connector module 12 (e.g., a top portion) and a portion of the conductive via 13 (e.g., a top portion) are exposed from the package body 15. For example, the top portion of the connector module 12 and a top portion of the conductive via 13 are substantially coplanar with a top surface of the package body 15. In some embodiments, the package body 15 includes an epoxy resin having fillers, a molding compound (e.g., an epoxy molding compound or other molding compound), a polyimide, a phenolic compound or material, a material with a silicone dispersed therein, or a combination thereof. In some embodiments, the package body 15 and the package body 12p of the connector module 12 may include the same material. Alternatively, the package body 15 and the package body 12p of the connector module 12 may include different materials.

The shielding layer 14 is disposed on an external surface of the package body 15 and covers the package body 15, the electronic components 11a, 11b, the connector module 12 and lateral surfaces of the carrier 10. The shielding layer 14 may be electrically connected to grounding elements of the carrier 10. The shielding layer 14 is in contact with the conductive via 13. The shielding layer 14 may include one or more openings 14h to expose the portion of the connector module 12 exposed from the package body 15 for electrical connections between the semiconductor device package 1 and external devices 18a and 18b through electrical contacts 12s2 (e.g., solder balls). In some embodiments, the shielding layer 14 is a conductive thin film, and may include, for example, Al, Cu, Cr, Sn, Au, Ag, Ni or stainless steel, or a mixture, an alloy, or other combination thereof. The shielding layer 14 may include a single conductive layer or multiple conductive layers. In some embodiments, the shielding layer 14 includes multiple conductive layers, and the multiple conductive layers may include a same material, or ones of the multiple conductive layers may include different materials, or each of the multiple conductive layers may include different materials from others of the multiple conductive layers.

In some comparative embodiments, many types of connectors are not integrated into a connector module (i.e., discrete), and the connectors and other electronic components (e.g., chips, dies, passive components) also discrete. In other words, the connectors and the electronic components are discrete elements, and connected to each other through a PCB. However, long signal transmission paths on the PCB would cause a transmission loss issue and a heat dissipation issue. In addition, the signal transmitted from one connector to an electronic component or from one connector to another connector would pass various mediums, which would cause an impedance mismatch issue. In accordance with the embodiments as shown in FIG. 1 and FIG. 2, one or more types of the connectors 12a, 12b and 12c are integrated into a connector module 12, and the connector module 12 and the electronic components 11a and 11b are integrated into a semiconductor device package 1. The above issues for the comparative embodiments can be resolved or mitigated.

FIG. 3A, FIG. 3B, FIG. 3C, FIG. 3D, FIG. 3E and FIG. 3F illustrate a semiconductor manufacturing method in accordance with some embodiments of the present disclosure. In some embodiments, the method in FIG. 3A, FIG. 3B, FIG. 3C, FIG. 3D, FIG. 3E and FIG. 3F can be used to manufacture the connector module 12 in FIG. 1 or FIG. 2. Alternatively, the method in FIG. 3A, FIG. 3B, FIG. 3C, FIG. 3D, FIG. 3E and FIG. 3F can be used to manufacture any other connector modules.

Figure 3A:
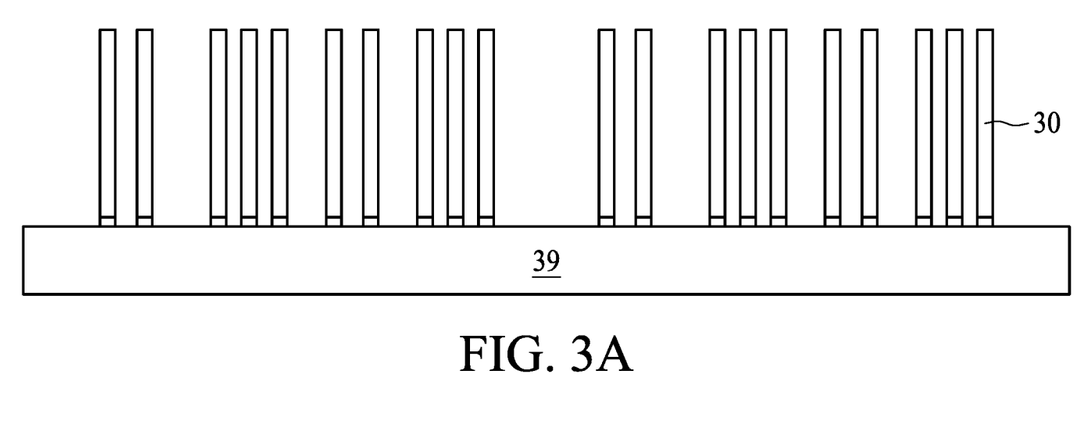
FIG. 3A, FIG. 3B, FIG. 3C, FIG. 3D, FIG. 3E and FIG. 3F illustrate a semiconductor manufacturing method in accordance with some embodiments of the present disclosure.

Referring to FIG. 3A, a carrier 39 is provided. A plurality of conductive pins or posts 30 (e.g., Cu pins or posts) are formed on the carrier 39 by, for example, surface mount technique (SMT) or any other suitable processes. The conductive pins 30 may include signal pins and ground pins as shown in FIG. 2. In some embodiments, the conductive pins 30 may define one or more types of connectors (e.g., the connectors 12a, 12b and 12c) as shown in FIG. 1 or FIG. 2.

Figure 3B:
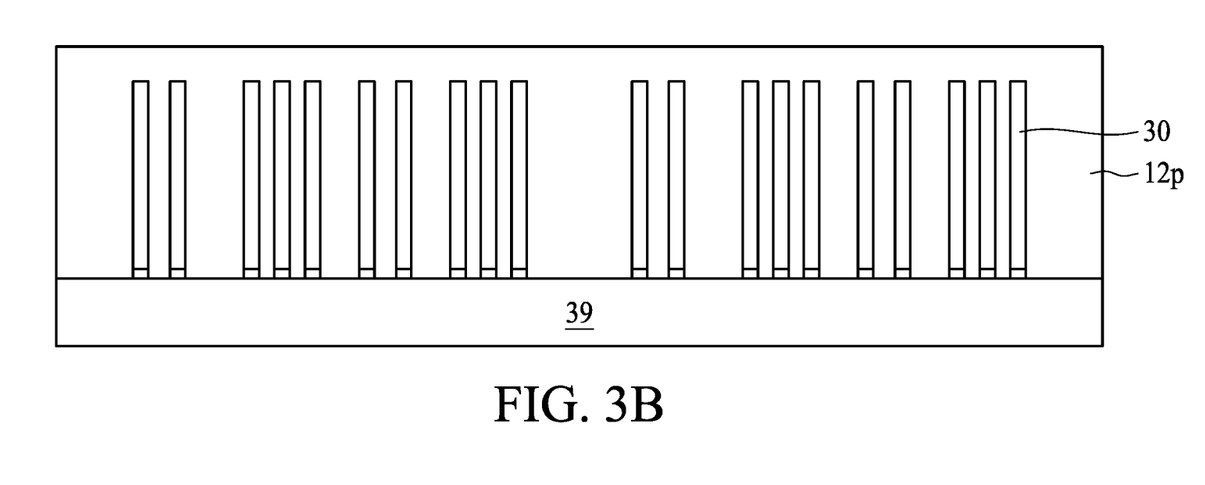

Referring to FIG. 3B, a package body 12p is formed or disposed on the carrier 39 and encapsulates the conductive pins 30. In some embodiments, the package body 12p may be formed or disposed by a molding technique, such as transfer molding or compression molding.

Figure 3C:
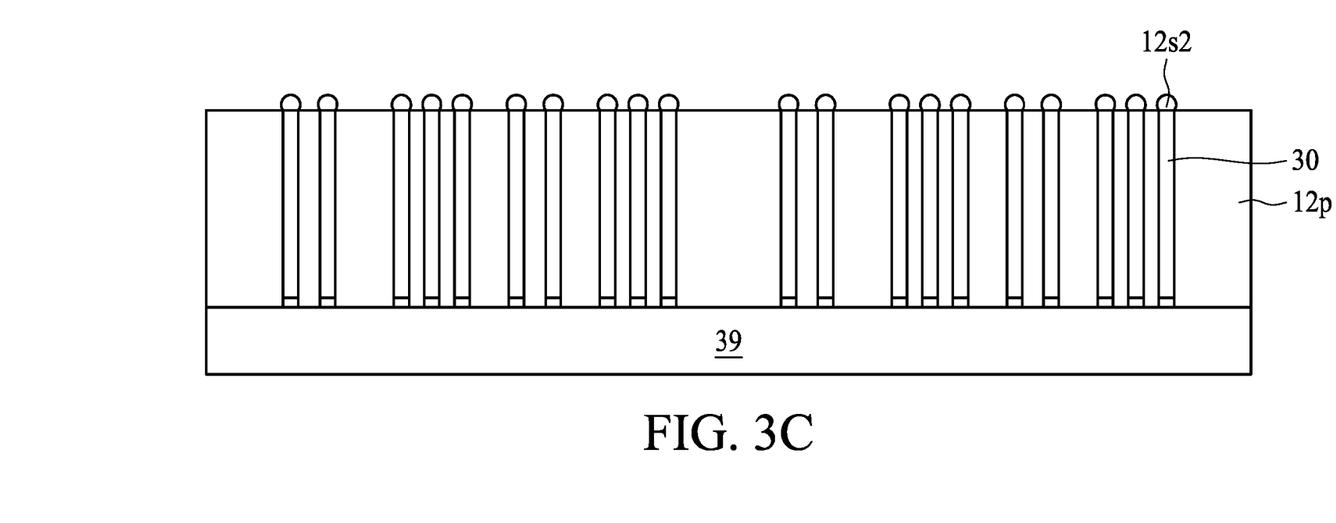

Referring to FIG. 3C, a portion of the package body 12p is removed to expose a top portion of the conductive pins 30. In some embodiments, the package body 12p can be removed by, for example, grinding or any other suitable processes. Electrical contacts 12s2 (e.g., solder balls) are then formed on the exposed portion of the conductive pins 30.

Figure 3D:
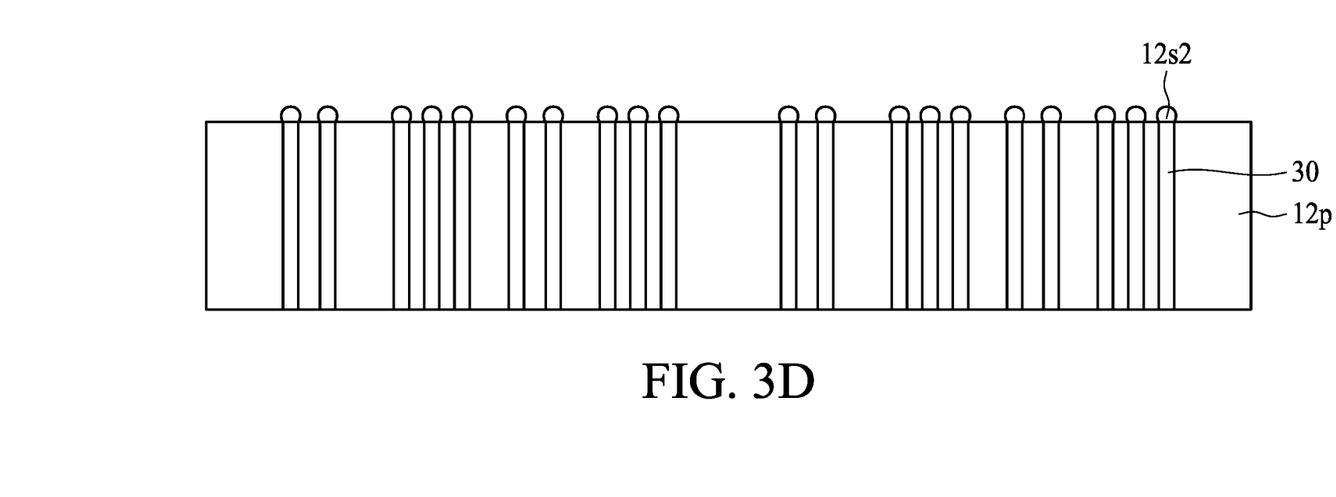
Figure 3E:
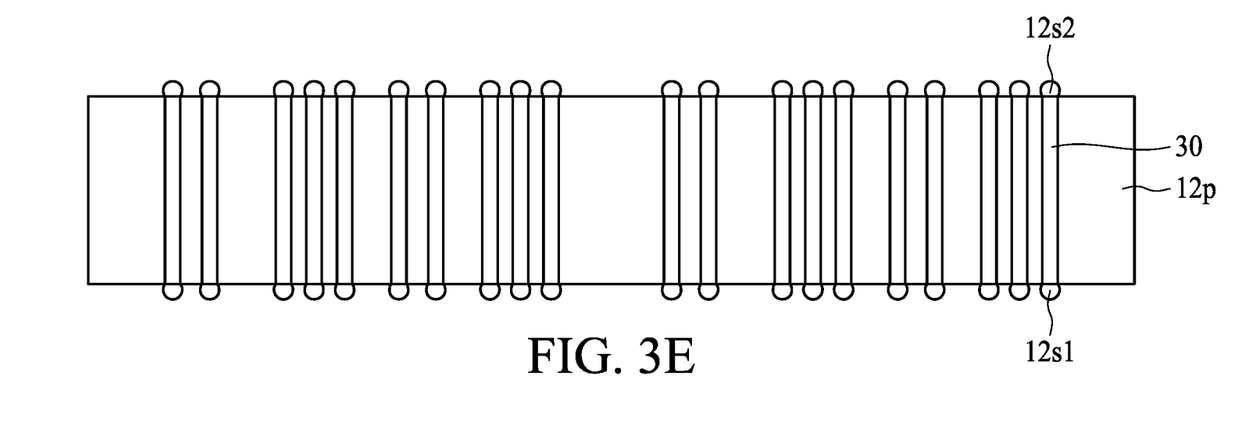

Referring to FIG. 3D, the carrier 39 is removed to expose a bottom portion of the conductive pins 30. Electrical contacts 12s1 (e.g., solder balls) are then formed on the exposed portion of the conductive pins 30 as shown in FIG. 3E.

Figure 3F:
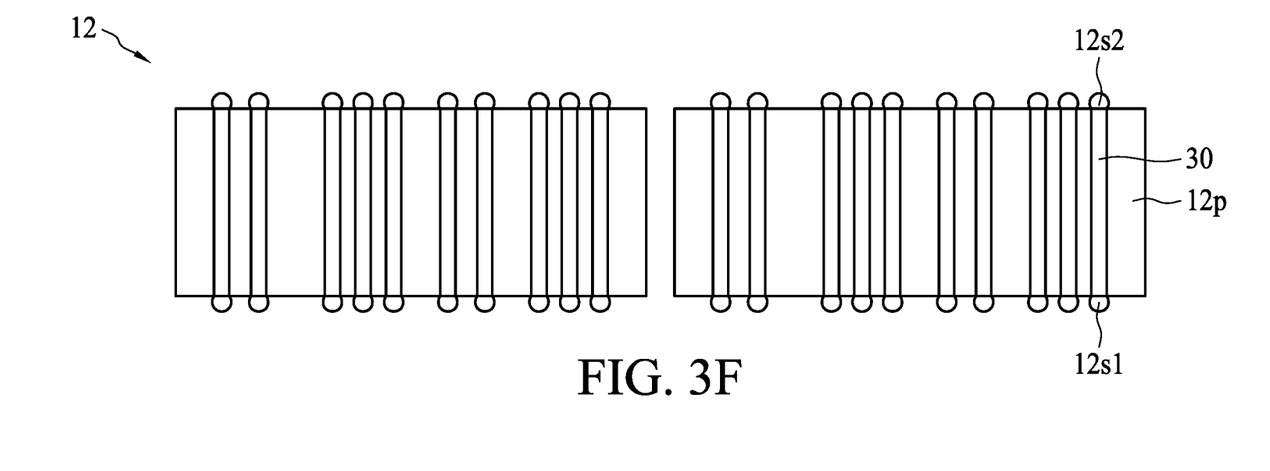

Referring to FIG. 3F, singulation may be performed to separate individual connector modules including the connector module 12 as shown in FIG. 1 or FIG. 2. For example, the singulation is performed through the package body 12p. The singulation may be performed, for example, by using a dicing saw, laser or other suitable cutting technique.

FIG. 4A, FIG. 4B, FIG. 4C, FIG. 4D, FIG. 4E, FIG. 4F and FIG. 4G illustrate a semiconductor manufacturing method in accordance with some embodiments of the present disclosure. In some embodiments, the method in FIG. 4A, FIG. 4B, FIG. 4C, FIG. 4D, FIG. 4E, FIG. 4F and FIG. 4G can be used to manufacture the semiconductor device package 1 in FIG. 1 or FIG. 2. Alternatively, the method in FIG. 4A, FIG. 4B, FIG. 4C, FIG. 4D, FIG. 4E, FIG. 4F and FIG. 4G can be used to manufacture any other semiconductor device packages.

Figure 4A:
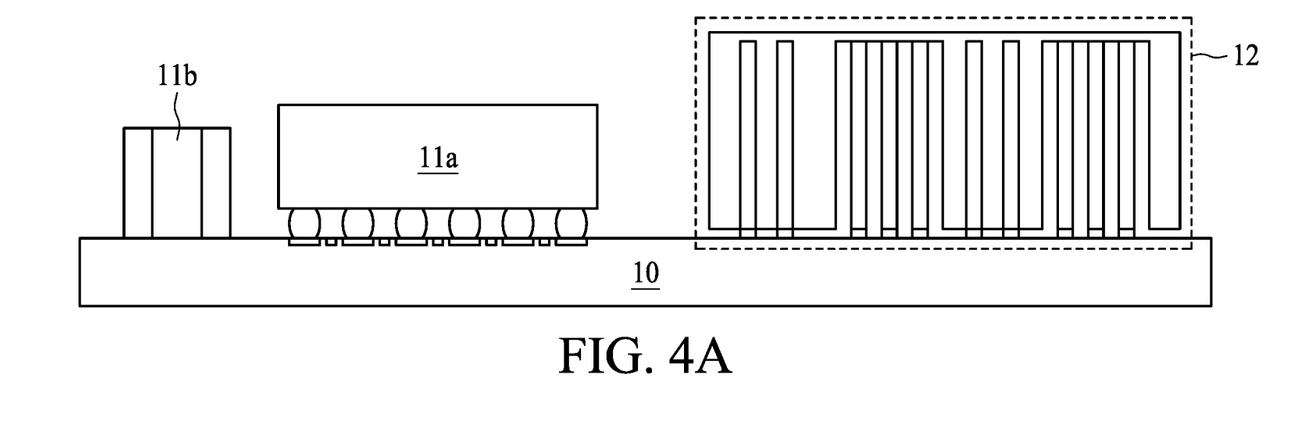
FIG. 4A, FIG. 4B, FIG. 4C, FIG. 4D, FIG. 4E, FIG. 4F and FIG. 4G illustrate a semiconductor manufacturing method in accordance with some embodiments of the present disclosure.

Referring to FIG. 4A, a carrier 10 is provided. Electronic components 11a, 11b and the connector module 12 are formed or disposed on the carrier 10. The electronic component 11a may be an active electronic component, such as an IC or a die. The electronic component 11b may be a passive electronic component, such as a capacitor, a resistor or an inductor. The connector module 12 may be formed by the method illustrated in FIG. 3A, FIG. 3B, FIG. 3C, FIG. 3D, FIG. 3E and FIG. 3F.

Figure 4B:
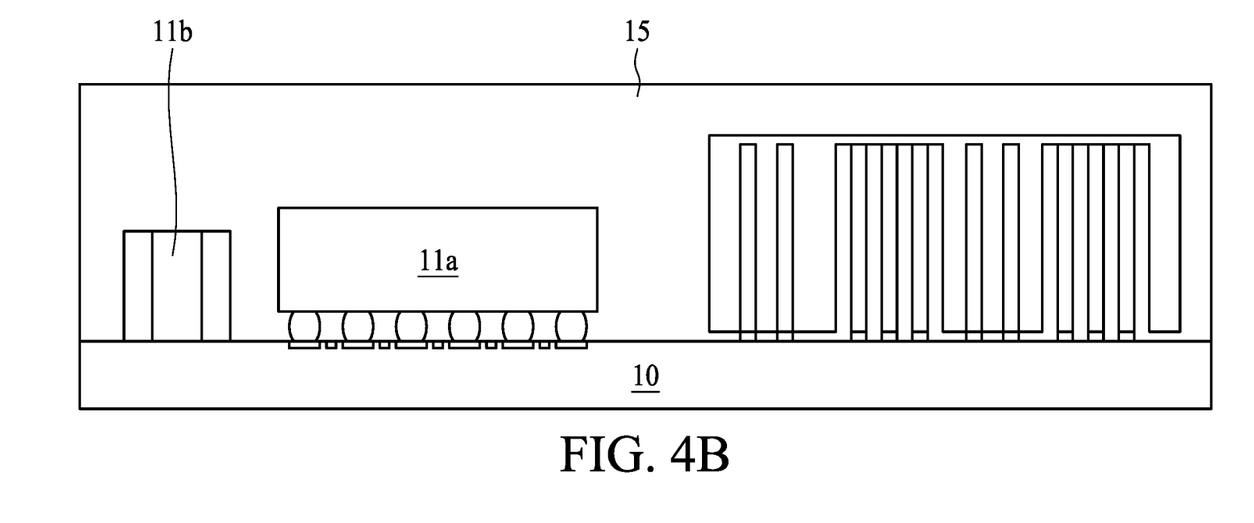

Referring to FIG. 4B, a package body 15 is formed or disposed on the carrier 10 and encapsulates the electronic components 11a, 11b and the connector module 12. In some embodiments, the package body 15 may be formed or disposed by a molding technique, such as transfer molding or compression molding.

Figure 4C:
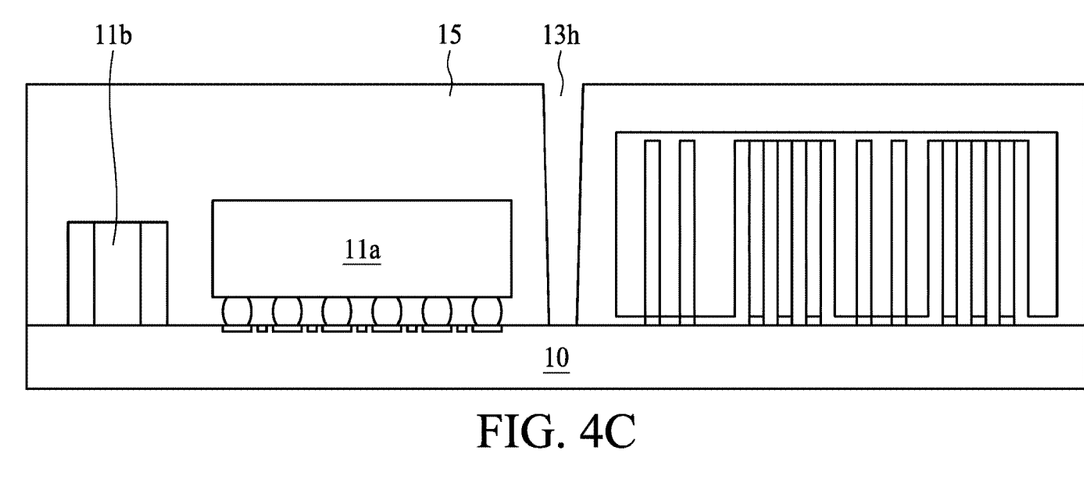

Referring to FIG. 4C, an opening 13h (or through hole) is formed to penetrate the package body 15 to expose a portion of the carrier 10. In some embodiments, the opening 13h may be formed by through mold via (TMV) technique or any other suitable processes.

Figure 4D:
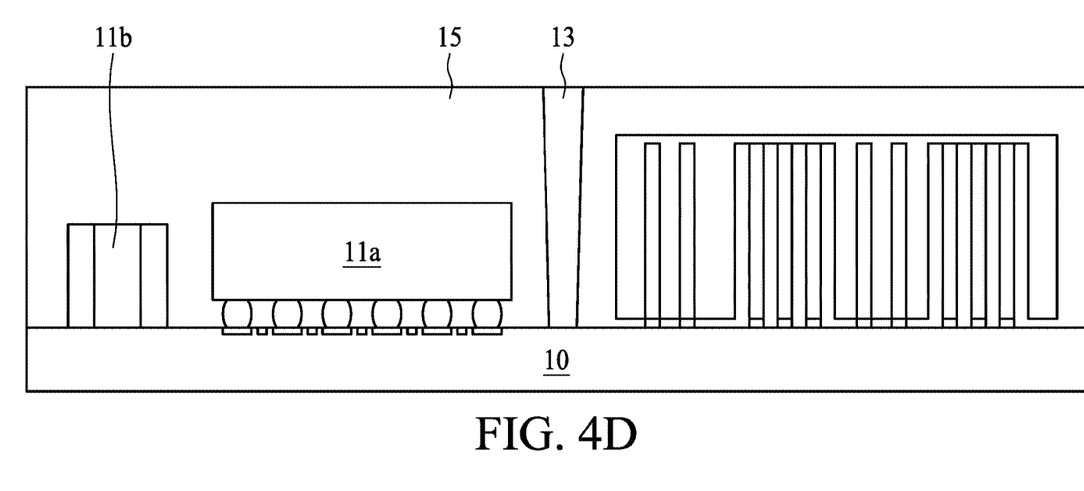

Referring to FIG. 4D, a conductive material is then formed or disposed within the opening 13h to form the conductive via 13. In some embodiments, the conductive via 13 may be formed by, for example, plating, plating or any other suitable processes.

Figure 4E:
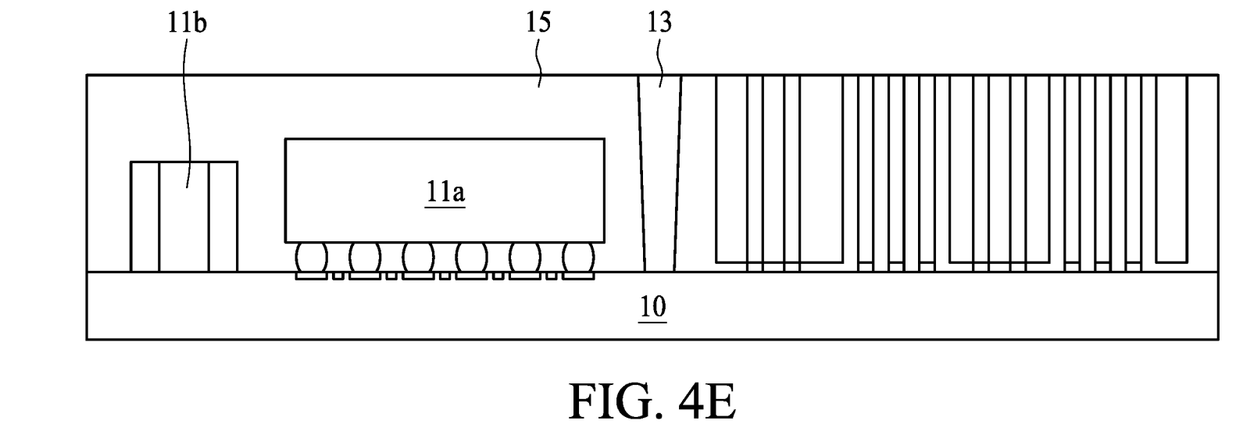

Referring to FIG. 4E, a portion of the package body 15 is removed to expose a top portion of the conductive via 13 and a top portion of the connector module 12. In some embodiments, the package body 15 can be removed by, for example, grinding or any other suitable processes.

Figure 4F:
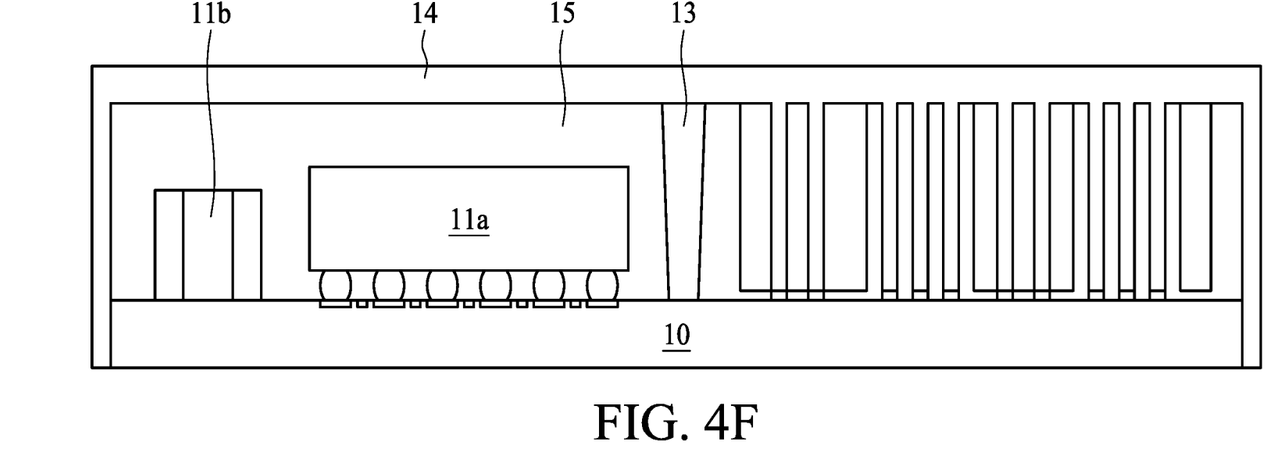

Referring to FIG. 4F, a shielding layer 14 is formed on an external surface of the package body 15 and covers the package body 15, the electronic components 11a, 11b, the connector module 12 and lateral surfaces of the carrier 10. The shielding layer 14 is in contact with the top portion of the conductive via 13. In some embodiments, the shielding layer 14 may be formed by, for example, plating, plating or any other suitable processes.

Figure 4G:
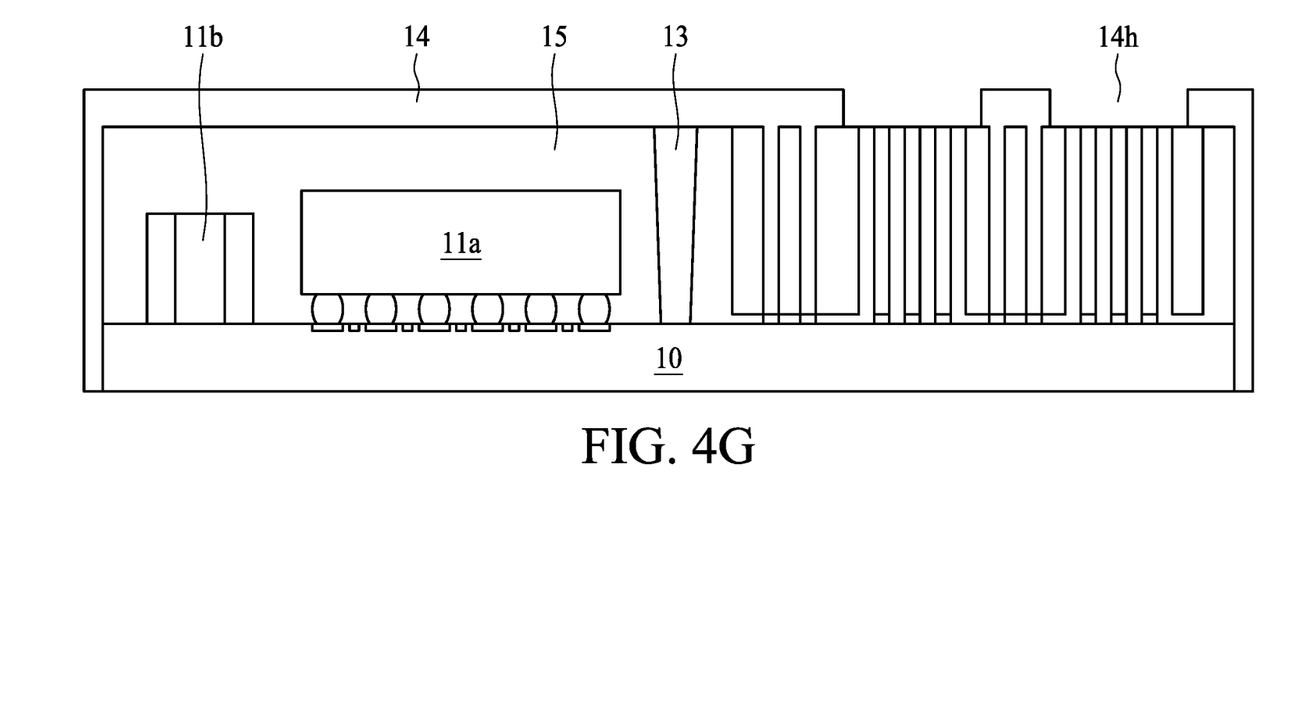

Referring to FIG. 4G, one or more openings 14h are formed to expose the top portion of the connector module 12 exposed from the package body 15 to provide electrical connections. Then external devices 18a, 18b may be connected to the exposed portion of the connector module 12 to form the semiconductor device package 1 as shown in FIG. 1. The external devise 18a and 18b may be connected to the connector module 12 by SMT technique or any other suitable processes.

In the description of some embodiments, a component provided "on" another component can encompass cases where the former component is directly on (e.g., in physical contact with) the latter component, as well as cases where one or more intervening components are located between the former component and the latter component.

In the description of some embodiments, a component characterized as "light transmitting" or "transparent" can refer to such a component as having a light transmittance of at least 80%, such as at least 85% or at least 90%, over a relevant wavelength or a relevant range of wavelengths, such as a peak infrared wavelength or a range of infrared wavelengths emitted by a light emitter. In the description of some embodiments, a component characterized as "light shielding," "light blocking," or "opaque" can refer to such a component as having a light transmittance of no greater than 20%, such as no greater than 15% or no greater than 10%, over a relevant wavelength or a relevant range of wavelengths, such as a peak infrared wavelength or a range of infrared wavelengths emitted by a light emitter.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations do not limit the present disclosure. It will be clearly understood by those skilled in the art that various changes may be made, and equivalents may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it should be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
a carrier;
an electronic component disposed on the carrier; and
a connector disposed on the carrier and electrically connected to the electronic component through the carrier, the connector having a first group of pins, a second group of pins and a group of common ground pins disposed between the first group of pins and the second group of pins to separate the first group of pins and the second group of pins,
wherein the connector and the electronic component are non-overlapping in a direction substantially perpendicular to a surface of the carrier, and
wherein a top surface of the connector is higher than a top surface of the electronic component.

2. The semiconductor device package of claim 1, further comprising a conductive via, wherein the conductive via is configured to be a compartment shielding to provide electromagnetic interference (EMI) shielding between the electronic component and the connector.

3. The semiconductor device package of claim 2, wherein the conductive via, the electronic component, and the connector are non-overlapping in a direction substantially perpendicular to a surface of the carrier.

4. The semiconductor device package of claim 3, further comprising a package body covering the electronic component and the connector, wherein the conductive via penetrates the package body.

5. The semiconductor device package of claim 4, wherein a height of the conductive via is substantially the same as a thickness of the package body.

6. The semiconductor device package of claim 1, further comprising a shielding layer disposed on the connector, the shielding layer including a first opening to expose the first group of pins and a second opening to expose the second group of pins.

7. The semiconductor device package of claim 1, further comprising:
a first package body encapsulating the connector to constitute a connector module disposed on the carrier; and
a second package body encapsulating the connector module and the electronic component.

8. The semiconductor device package of claim 1, wherein the group of common ground pins is closer to the electronic component than the first group of pins and the second group of pins.

9. The semiconductor device package of claim 8, wherein the group of common ground pins separates the electronic component, the first group of pins, and the second group of pins from each other.

10. A semiconductor device package, comprising:
a carrier;
an electronic component disposed on the carrier;
a connector disposed on the carrier and electrically connected to the electronic component through the carrier, the connector having a first group of pins, a second group of pins and a group of common ground pins disposed between the first group of pins and the second group of pins to separate the first group of pins and the second group of pins;
a first package body encapsulating the connector to constitute a connector module disposed on the carrier; and
a second package body encapsulating the connector module and the electronic component,
wherein a portion of the second package body is disposed between a bottom surface of the connector module and a top surface of the carrier.

11. The semiconductor device package of claim 7, further comprising a shielding layer in contact with a top surface and a lateral surface of the second package body, wherein the shielding layer is in contact with a ground pin of the group of common ground pins exposed from the first package body.

12. The semiconductor device package of claim 6, wherein the first opening of the shielding layer is adapted to accommodate an external device for being electrically connected to the connector.

\* \* \* \* \*